United States Patent [19]
Simko

[11] Patent Number: 5,294,819
[45] Date of Patent: Mar. 15, 1994

[54] SINGLE-TRANSISTOR CELL EEPROM ARRAY FOR ANALOG OR DIGITAL STORAGE

[75] Inventor: Richard T. Simko, Los Altos, Calif.

[73] Assignee: Information Storage Devices, San Jose, Calif.

[21] Appl. No.: 981,610

[22] Filed: Nov. 25, 1992

[51] Int. Cl.$^5$ .................................... H01L 29/78
[52] U.S. Cl. .................................... 257/314; 257/315; 257/321; 257/322; 365/185; 365/189.01; 365/230.01
[58] Field of Search .............. 257/390, 391, 315, 314, 257/324, 321, 322; 365/103, 104, 182, 185, 189.01, 230.01

[56] References Cited

U.S. PATENT DOCUMENTS

| | | | |
|---|---|---|---|
| 3,984,822 | 10/1976 | Simko et al. | 340/173 R |
| 4,099,196 | 9/1978 | Simko | 357/23 |
| 4,119,995 | 10/1978 | Simko | 357/23 |
| 4,314,265 | 2/1982 | Simko | 357/23 |
| 4,701,776 | 10/1987 | Perlegos et al. | 357/23.5 |
| 4,890,259 | 12/1989 | Simko | 365/45 |

OTHER PUBLICATIONS

Nonvolatile Memories, A 5V-Only 256k bit CMOS Flash EEPROM, International Solid-State Circuits Confreence (ISSCC) Digest of Technical Papers, pp. 108-109, Sebastiano D'Arrigo et al., 1982.
Nonvolatile Memories, A 16k E$^2$PROM, International Solid-state Circuits Confreence (ISSCC) Digest of Technical Papers, pp. 132-133, Giora Yaron et al., 1989.

*Primary Examiner*—William Mentel
*Attorney, Agent, or Firm*—Blakely, Sokoloff, Taylor & Zafman

[57] ABSTRACT

The present invention discloses methods and apparatus for implementing a single-transistor cell EEPROM array for analog or digital storage. The single-transistor storage cell is made possible by continuously maintaining a net negative charge on the floating gate of the EEPROM storage transistor. Furthermore, according to the present invention, a dense layout of the single-transistor cells is possible by sharing a common diffusion region between the transistors located in the same row and the transistors located in one adjacent row. This common diffusion region functions as a source in the erase and program modes, and as a drain in the read mode. Moreover, the common diffusion feature of the present invention allows the use of a single level of metal in distributing the various operating voltages to the EEPROM storage transistors. Further, utilizing a single level of metal allows for a simple and dense fabrication and also reduces the parasitic capacitances in the EEPROM storage array. Array operating voltages are chosen such that "program disturbance" is eliminated on cells adjacent to a cell undergoing programming. Finally, the present invention utilizes only a single polarity of operating voltages.

44 Claims, 5 Drawing Sheets

| | WL1 | WL2 | Col 1 | Col 2 | S | (Volts) |
|---|---|---|---|---|---|---|
| ERASE | 18 | 0 | 0 | 0 | 0 | |
| PROGRAM | 0 | ~9 | (1) 9-18 | (3) Float | ~11 | |
| READ | 4 | 0 | (2) 0-3 | (2) 0-3 | 4 | |

(1) Analog High Voltage Input Range (2) Analog Output Range (3) Estimated Float Potential is 4 to 8 Volts.

SINGLE-TRANSISTOR CELL EEPROM ARRAY FOR ANALOG OR DIGITAL STORAGE

BACKGROUND OF THE INVENTION

1. Field of the Invention

The present invention relates to the field of nonvolatile storage arrays. More particularly, the present invention relates to the field of electrically erasable and programmable ROM (EEPROM) storage arrays.

2. Description of the Prior Art

The status of the prior art in the field of electrically erasable and programmable ROM (EEPROM) storage arrays is best illustrated by considering the pertinent prior art patents and publications in this field. In that regard, one of the earlier patents in the field is U.S. Pat. No. 3,984,822. This patent describes a Double Polycrystalline Silicon Gate Memory Device. This device is programmed by the "hot electron" injection method, as distinct from the Fowler-Nordheim electron tunneling method of the present invention. The "hot electron" programming mechanism performs poorly above room temperature. This is because, as the ambient temperature increases, the "avalanche breakdown" channel current scatters charge carriers and thus decreases the efficiency of "hot" electron injection.

Another difference between the '822 patent and the present invention is that the avalanche breakdown required for the "hot electron" injection mechanism of the '822 patent requires an undesirably large amount of current, for example, a current of one milliampere. Thus, the '822 patent requires a large amount of current for successful programming. Finally, the memory device of the '822 patent is generally erasable only by exposure to ultraviolet radiation, as distinct from the electrical erasure capability of the present invention.

U.S. Pat. Nos. 4,099,196, 4,119,995, 4,314,265, and 4,701,776 all disclose the Fowler-Nordheim electron tunneling mechanism for programming and erasing employed in the present invention. However, each patent is fundamentally distinguishable from the present invention. First addressing the '196 and '265 patents, these patents are fundamentally different from the present invention because, among other things, both patents require one "Control" gate, one "Program" gate, and one "Erase" gate, whereas the present invention replaces all of these three gates with a single Control gate. Furthermore, both the '196 and '265 patents leave a net positive charge on the floating gates of the erased EEPROM transistors. As such, in both patents, the storage device is rendered conductive in the erased condition. By contrast, in accordance with the present invention, a net negative charge is always maintained on the floating gate of the EEPROM transistors. Therefore, the storage transistor of the present invention is not rendered conductive solely because that transistor is in the erased condition.

Next, turning to the '995 patent, this patent requires a select transistor in addition to the programmable storage transistor. This is because according to the '995 patent, a net positive charge is left on the floating gate of an erased storage transistor. Therefore, an additional transistor is needed to prevent the bit line connected to an unselected erased storage transistor from being pulled down to the ground voltage. By contrast, in accordance with the present invention, a net negative charge is always maintained on the floating gate. Therefore, the storage transistor of the present invention is not rendered conductive solely because that transistor is in the erased state. Thus, the present invention does not require any additional transistors to prevent a bit line connected to an unselected erased transistor from being pulled down to ground. It is noted that in a typical digital circuit, the undesirable pulling down of a bit line was a problem. However, as will be described below, the potential problem for analog storage circuits is that the column lines may be undesirably pulled high by deselected cells.

Next, discussing the '776 patent, this patent discloses a two-transistor memory cell. By contrast, the storage array of the present invention is comprised of one-transistor cells. The one-transistor cell constitutes one of the advantages of the present invention.

Further, among the relevant publications are the 1982 International Solid-State Circuits Conference (ISSCC) Digest of Technical Papers, page 108–109, and the 1989 ISSCC Digest of Technical Papers, page 132–133. The 1982 a "16K EEPROM" by National Semiconductor. The disclosure of this paper is fundamentally different from the present invention because, among other things, according to this paper each memory cell is comprised of two transistors. By contrast, the present invention utilizes one-transistor cells. As a result, the storage array of the present invention is much smaller and also much less expensive to manufacture than the storage arrays of the prior art.

Furthermore, the 1989 paper discloses a "5V-Only 256K Bit CMOS Flash EEPROM" by Texas Instruments. This paper is also fundamentally distinguishable from the present invention. For example, each cell of the EEPROM disclosed by this paper is composed of two transistors as opposed to the one-transistor cell of the present invention. Further, the EEPROM disclosed by this paper requires both negative and positive polarities of supply voltages. By contrast, the present invention operates on a single positive polarity of supply voltage.

In sum, the above prior art patents and publications have not disclosed a dense one-transistor EEPROM storage array which operates based on the electron tunneling mechanism. Moreover, the present invention is fundamentally different from the above cited prior art and other relevant prior art in many other respects which differences will be explained in the following sections of this document.

Finally, it is noted that the means for determining and generating the operating voltages to program, erase, or read an addressed EEPROM storage transistor of the present invention is disclosed in the U.S. Pat. No. 4,890,259. However, the present invention addresses entirely different aspects of the operation of an EEPROM storage array from what is disclosed by the '259 patent. In fact, as stated above, the present invention utilizes the operating voltages generated by the method disclosed in the '259 patent to implement a new EEPROM storage array. Thus, unlike the '259 patent, the present invention does not address methods of determining and generating the various operating voltages required for programming, erasing, or reading a storage EEPROM transistor. Further, the present invention is fundamentally different from the '259 patent because for example, unlike the '259 patent, the present invention addresses the operation of the individual EEPROM storage cells themselves.

BRIEF SUMMARY OF THE INVENTION

The present invention discloses methods and apparatus for implementing a single-transistor cell EEPROM array for analog or digital storage. The single-transistor storage cell is made possible by continuously maintaining a net negative charge on the floating gate of the EEPROM storage transistor. Furthermore, according to the present invention, a dense layout of the single-transistor cells is possible by sharing a common diffusion region between the transistors located in the same row and the transistors located in one adjacent row. This common diffusion region functions as a source in the erase and program modes, and as a drain in the read mode. Moreover, the common diffusion feature of the present invention allows the use of a single level of metal in distributing the various operating voltages to the EEPROM storage transistors. Further, utilizing a single level of metal allows for a simple and dense fabrication and also reduces the parasitic capacitances in the EEPROM storage array. Array operating voltages are chosen such that "program disturbance" is eliminated on cells adjacent to a cell undergoing programming. Finally, the present invention utilizes only a single polarity of operating voltages.

DETAILED DESCRIPTION OF THE INVENTION

The present invention encompasses a unique storage cell, a new storage array structure, a single polarity operating voltage, and a method of programming, erasing, and reading analog or digital voltage levels for the new EEPROM storage array. Furthermore, the present invention presents other advances over the prior art which will be explained in this section.

Figure 1:
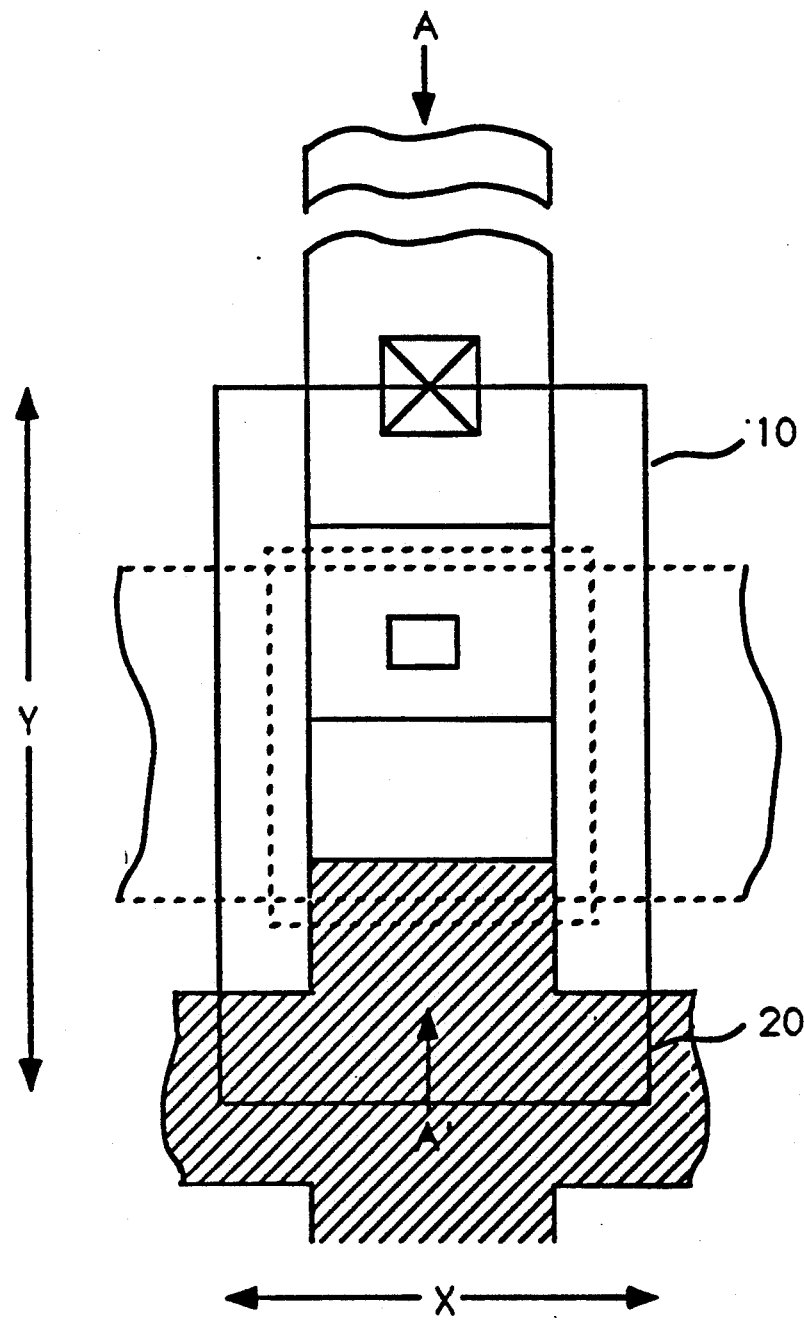
FIG. 1 shows the top view of the layout of the EEPROM storage cell of the present invention.

First addressing the storage cell, FIG. 1 shows the top view of the layout of the storage cell of the present invention. The area bound by the X and Y dimensions of FIG. 1, shown generally by the numeral 10, comprises one storage cell of the storage array of the present invention. This cell is repeated as many times as desired to construct an array of a desired size. Using the top view shown in FIG. 1, one can observe the common source 20 which is shown by the cross-hatched area. This common source 20 is shared between all of the EEPROM storage transistors of the the row in which the cell shown in FIG. 1 is located, and further between all of the EEPROM storage transistors located in the adjacent row. Therefore, according to the present invention, one large common source node exists for each two adjacent rows of EEPROM storage transistors.

This common source presents one of the advantages of the present invention since, for example, it accounts for a reduction in the area of the entire array. This advance by the present invention was not achievable by the relevant prior art storage arrays since the prior art required different voltages on the sources of two adjacent rows of EEPROM transistors. For example, if an addressed transistor located in one row is being programmed when none of the transistors of the adjacent row is to be programmed, the prior art would require a different voltage on the source nodes of the two rows. By contrast, the storage cell, structure of the array, and the operating voltages of the present invention allow the sharing of the source nodes of two adjacent rows as shown in FIG. 1. Hence, the overall design and operation of the present invention, which will be explained below, allow a dramatic reduction in the total area of an EEPROM storage array by allowing two adjacent rows to share their respective source nodes.

Figure 2:
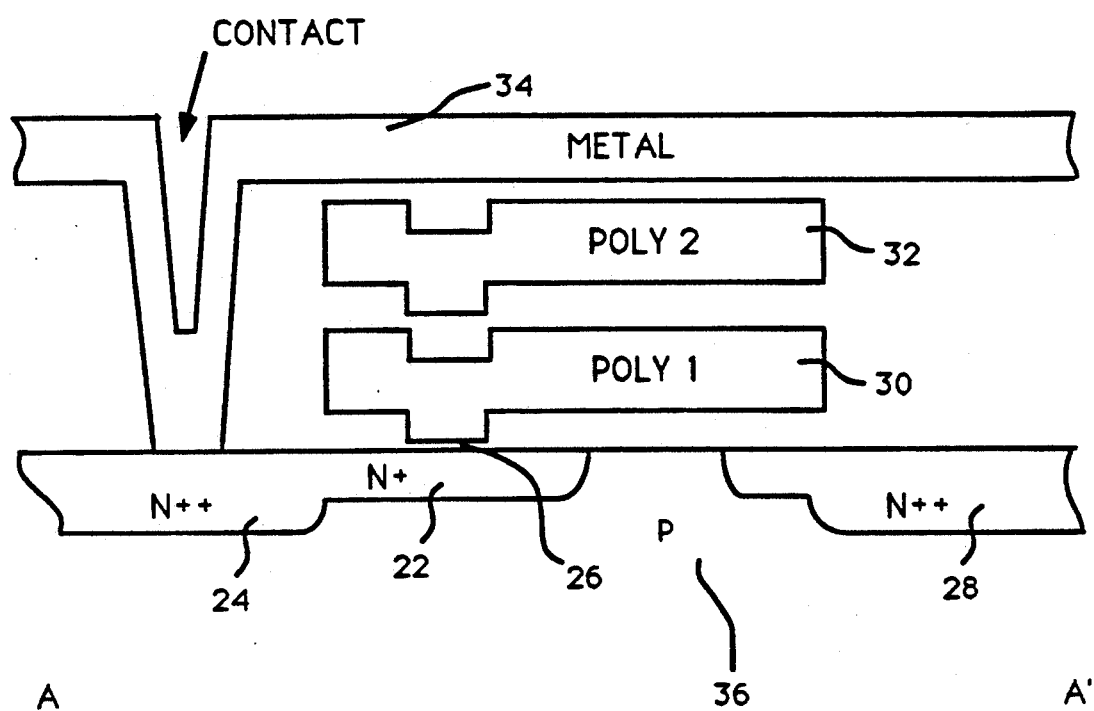
FIG. 2 shows the view of a cross section of FIG. 1 along the A—A' axis.

Continuing with the disclosure of the storage cell of the present invention, FIG. 2 shows a cross section of FIG. 1 along the A—A' axis. FIG. 2 also shows the preferred implementation of the storage EEPROM transistor of the present invention. This Figure illustrates the lightly doped N+ region 22 extended from the heavily doped N++ drain region 24. This lightly doped N+ region is immediately below a thin tunnel oxide 26. Furthermore, the first polysilicon level 30 (Poly 1), and the second polysilicon level 32 (Poly 2) comprise the floating and the control gate respectively. The Fowler-Nordheim electron tunneling occurs between the lightly doped N+ region 22 and the floating gate 30. Also shown FIG. 2, is the heavily doped N++ region 28 comprising the common source region discussed above. The substrate of the preferred implementation of the EEPROM transistor of the present invention is a lightly doped P-type substrate which is generally shown by the numeral 36 in FIG. 2. It is noted that this lightly doped P-type substrate of the preferred embodiment of the present invention is connected to the system ground. Thus, in the preferred embodiment of the present invention described herein, it is assumed that the substrate remains at the system ground voltage at all times. FIG. 2 also shows the metal interconnect 34 which contacts the drain region 24. The metal interconnect 34 also contacts the drains of all EEPROM storage transistors located in the same column.

Figures 3A, 3B:
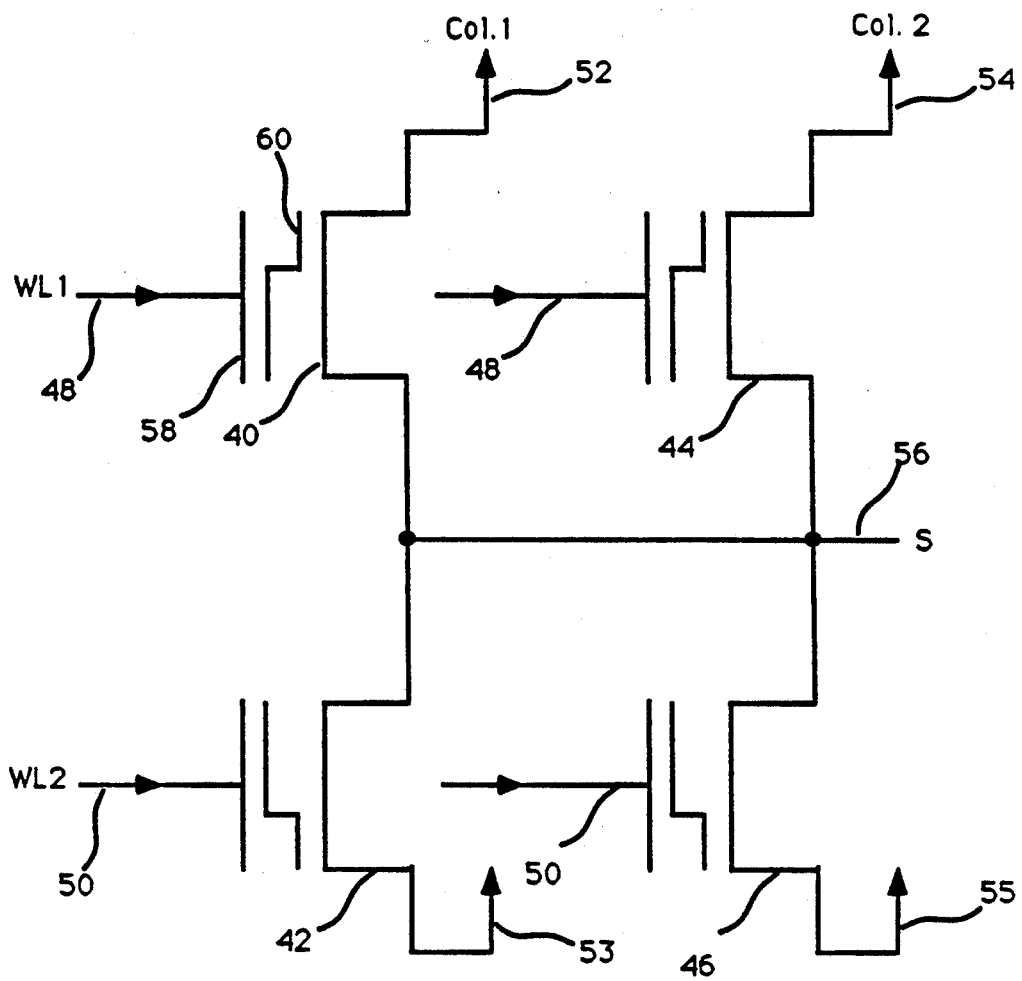
FIG. 3a depicts the arrangement of the single-transistor cells of the storage array of the present invention.
FIG. 3b shows the various operating voltages of the present invention used to perform the erase, program and read operations.

FIG. 3a depicts the arrangement of the transistor cells which will be referred to in the present discussion of the structure of the storage array of the present invention. It will become apparent that the unique structure of the storage array of the present invention combined with the operating voltages used for erasing, programming and reading the EEPROM transistors result in the one-transistor storage cell of the present invention, as contrasted with the two-transistor storage cells or merged transistor cells of the prior art. For the purpose of illustration and simplicity, the following discussion regarding the structure and operation of the EEPROM storage array of the present invention assumes that all of the transistors are N-channel, rather than P-channel, EEPROM transistors.

The structure and operation of the storage array of the present invention is now explained by reference to FIG. 3a. Suppose that the EEPROM storage transistor 40 is addressed and it is desired to "erase" this transistor. According to the present invention, upon the completion of the erasing process, the addressed transistor will have a high threshold voltage. This high threshold voltage will keep an EEPROM transistor in the nonconductive state even when the transistor is being read. Therefore, according to the present invention, an "erased" EEPROM transistor is always in the nonconducting state. Further, according to the present invention, the threshold voltage of an "erased" transistor is at least five volts. Thus, even when the control gate of an erased transistor is raised to five volts, the erased transistor will remain in the nonconductive state.

According to the present invention, erasing an addressed transistor requires several steps. Referring again to FIG. 3a, suppose that the EEPROM transistor 40 is to be erased. To accomplish the erasing operation, the word line 48 driving the control gate of transistor 40 is raised to a sufficiently high voltage, for example to approximately eighteen volts, and the control gate is kept at that voltage for a sufficiently long time, for example one millisecond. Furthermore, the common source 56 and the drain 52 of transistor 40 are kept at zero volts. In this condition, a high electric field is formed for approximately one millisecond, with a direction from the control gate 58 of transistor 40 towards the drain 52 of that transistor. This high electric field will cause a large number of electrons to "tunnel" from the drain of transistor 40, through a thin tunnel oxide, to the floating gate 60 of that transistor during the one millisecond that the electric field exists. The presence of this large number of electrons on the floating gate 60 of transistor 40 will result in a net negative charge on the floating gate.

It is noted that it is possible to simultaneously erase all of the EEPROM transistors of the row in which the addressed transistor 40 is located. This is simply accomplished by reducing the drain voltages of other transistors in that row to zero volts. For example, in order to erase transistor 44 simultaneously with transistor 40, the drain voltage 54 must be lowered to zero volts. Furthermore, to prevent the transistors in an adjacent row from being inadvertently erased, the word lines driving the EEPROM transistors of that adjacent row are pulled down to the ground voltage.

The first line of FIG. 3b lists the various operating voltages required to erase only the transistors located in the row which is driven by the word line 48 (WL1), while preventing all other transistors in the storage array from being erased. As indicated in the first line of FIG. 3b, to accomplish this end, the word line 48 is raised to a high voltage, while all other nodes in the array are kept at the ground voltage. Thus, during the erase operation, the operating voltage applied to WL2 (word line 50) is also applied to all other word lines of the storage array, except of course to word line 48 (WL1). Similarly, the operating voltage applied to column 2 is also applied to all other columns of the storage array, except of course to column 1.

Next, the programming operation is explained. The programming operation is more complicated than either the erase or the read operations. Initially, it is noted that the threshold voltage of a virgin (neither previously programmed or erased) transistor, which has no net charge on its control gate, is zero volts. After the completion of the programming operation, the programmed EEPROM transistor will be left with a threshold voltage between one to four volts. This threshold voltage corresponds to the analog voltage or the digital value that the addressed transistor is to represent upon being read. (The specifics of the read operation are explained later in this document). To illustrate, a threshold voltage close to four volts is programmed when the voltage level to be represented by the programmed EEPROM transistor is a low analog voltage (or a digital value of "Zero"). When the addressed transistor is read back in a subsequent operation, a low voltage of approximately zero volts is outputted on the column of the transistor, signifying the same low analog voltage (or the digital value of "Zero") that the addressed transistor was programmed to represent in the earlier programming operation. Conversely, a threshold voltage close to one volt is stored when the voltage level being represented by the programmed transistor is a high analog voltage (or a digital value of "One"). When the addressed transistor is read back in a subsequent operation, a high voltage of approximately three volts is outputted on the column of the transistor, signifying the same high analog voltage (or the digital value of "One") that the addressed transistor was programmed to represent in the earlier programming operation.

It is noted that, according to the present invention, the EEPROM storage transistor can represent either analog or digital voltages. This capability of the EEPROM storage array of the present invention to store either analog or digital values presents several advantages over the prior art. For example, according to the present invention, a single EEPROM storage transistor may represent a continuum of voltage levels. By contrast, according to the prior art, a large number of digital storage transistors had to be employed to represent (i.e., encode) a single analog voltage. Thus, representing a continuum of analog voltage levels required the utilization of a large area of the prior art storage arrays. Therefore, by using the analog storage capability of the present invention, a very significant reduction in the size of the EEPROM storage array is achieved.

Furthermore, the EEPROM storage array of the present invention can be used to represent discrete analog voltage levels corresponding to several digital "bits." For example, a single EEPROM storage transistor of the present invention can be programmed to four distinct threshold voltage levels between one and four volts. These four different threshold voltage levels can thus represent four different analog values in a subsequent read operation. To achieve the same result, the prior art required use of two storage transistors, representing two digital bits. By the same token, using a single EEPROM storage transistor of the present invention to represent sixteen discrete voltage levels is equivalent to using four bits of the prior art storage transistors. Thus, it can be seen that using the analog storage capability of the EEPROM storage transistors of the present invention, a dramatic reduction in the size of the storage array is achieved.

Now the programming operation is explained with more specificity. According to the present invention, the amount of net negative charge on the floating gate of a programmed transistor must correspond to the analog voltage to be represented by that transistor. Further, according to the present invention, the net charge on the floating gate of an EEPROM transistor must always remain negative. This is so because, according to one feature of the present invention, the threshold voltages of all of the EEPROM transistors of the storage array are kept above zero volts. Thus, all of the EEPROM transistors are rendered nonconductive when their respective control gates are at or below zero volts. This in turn allows the present invention to use only one transistor per cell. Therefore, the present invention does not require the series select transistor of the prior art.

To illustrate this, it is noted that the prior art EEPROM storage cells must utilize a second "select" transistor in addition to the EEPROM storage transistor. This was necessary in the prior art since either the erase or the program operations created a net positive charge on the floating gate which caused the EEPROM transistors to become conductive. Because the EEPROM transistors were rendered conductive, it became necessary to use a "select" transistor. This select transistor prevented the bit line connected to a conductive EEPROM transistor from being unintendedly pulled low. In the present invention, the unselected EEPROM transistors are never rendered conductive after either the erase or the program operations. As such, the need for a select transistor is eliminated and a one-transistor storage cell is achieved. This achievement represents one of the advances of the present invention over the prior art.

Thus, according to the present invention, the net charge on the floating gate of the EEPROM storage transistor must remain negative after programming the transistor. According to the present invention, the programming of a previously erased transistor removes sufficient amount of charge from the floating gate of the erased transistor such that the leftover charge corresponds to the voltage to be represented by the programmed transistor. Nevertheless, the net leftover charge must still remain negative. This amount of leftover net negative charge on the floating gate of the EEPROM transistor results in a threshold voltage between one to four volts. As expected, this threshold voltage is smaller than the five volts representing the larger net negative charge of the erased state. Nevertheless, a threshold voltage between one to four volts is large enough to render the programmed transistor nonconductive when the control gate of that transistor is at or below zero volts.

Now the various operating voltages used for programming an addressed transistor are discussed. Suppose that the EEPROM transistor 40 is to be programmed. In order to remove some negative charge from the floating gate 60, the drain 52 of transistor 40 must be raised to a sufficiently high voltage while the control gate 58 of transistor 40 is kept at the ground voltage. The difference in voltage between the drain 52 and the control gate 58 is such that a strong electric field is directed from the drain 52 to the control gate 58. This electric field is strong enough to remove just enough charge from the floating gate 60 to cause the threshold voltage of transistor 40 to be lowered to the desired value between one to four volts.

It is noted that the precise voltage that drain 52 must have to program transistor 40 depends on the voltage that transistor 40 is to represent upon the completion of the programming operation. (The method of determination and generation of the proper voltage of drain 52 is disclosed in the prior art U.S. Pat. No. 4,890,259. This patent was referred to in the "Description of the Prior Art" section above, the disclosure thereof being hereby incorporated herein by reference.) Thus, the voltage of drain 52 is varied between nine to eighteen volts depending on the voltage to be represented by transistor 40. As the voltage on drain 52 is increased, the amount of charge removed from the floating gate 60 is also increased and thus the threshold voltage of transistor 40 is lowered. Therefore, the exact threshold voltage of the programmed transistor 40 depends on the voltage of drain 52. This threshold, as stated above, ranges between one to four volts after the completion of the programming operation. Thus, a programming voltage of approximately eighteen volts on drain 52 translates into a threshold voltage of approximately one volt, and a programming voltage of approximately nine volts on drain 52 results in a threshold voltage of approximately four volts.

One of the reasons that programming is a complicated operation is that the status of the transistors in the row in which the addressed transistor is located, and the row adjacent thereto, must be carefully monitored to prevent "write disturbances." As with the above discussion, suppose that only transistor 40 is to be programmed, and that the remaining transistors in the storage array are to remain unaffected. First, considering transistor 42, it is noted that drain 53 of transistor 42 is connected to the same metallized column that drain 52 of transistor 40 is connected to. Therefore, drain 53 of transistor 42 experiences the same high voltages that drain 52 of transistor 40 experiences. Thus, in order to prevent transistor 42 from being unintendedly programmed, the control gate of that transistor, which is driven by word line 50, must be raised to a sufficiently high voltage. This high voltage limits the voltage difference between the drain 53 and the control gate of transistor 42 so that a high electric field is not created across the tunnel oxide. A control gate voltage of approximately nine volts has been found to be high enough to prevent transistor 42 from being inadvertently programmed.

However, fixing the control gate of transistor 42 at about nine volts creates further problems that must be resolved. In that regard, it is noted that the threshold voltage of transistor 42, even in the erased state, is less than nine volts. Therefore, raising the voltage of word line 50 to nine volts renders transistor 42 conductive. Thus, the voltage of the common source 56 of transistor 42 must be high enough so that the connection created from the source 56 of transistor 42 to drain 53 of that transistor does not substantially lower the high voltage of the metallized column connecting drain 53 to drain 52. For this reason, the voltage of the common source 56 is raised to approximately eleven to thirteen volts.

Next, turning to transistor 46, it is noted that the voltage of the control gate of this transistor is predetermined due to the fixing of the voltage of word line 50 discussed above. Thus, the voltage of the control gate of transistor 46 is fixed at approximately nine volts. Furthermore, the voltage of the common source 56 of transistor 46, being shared by transistor 42, is also already set to approximately eleven volts. Therefore, in order to prevent transistor 46 from being unwantedly programmed, the only voltage to be manipulated is the voltage of the drain 55. To prevent inadvertent programming of transistor 46, the electric field between drain 55 and the control gate of transistor 46 must be kept sufficiently small so that the net negative charge on the floating gate of transistor 46 is not disturbed. In order to keep this electric field to a minimum, the voltage of drain 55 of transistor 46 must be close to the voltage of the control gate of transistor 46. Thus, the voltage of drain 55 must be approximately nine volts. It has been found that if drain 55 is simply allowed to float, its voltage will reach a value of approximately four to eight volts, depending on the threshold voltage of transistor 46. A drain voltage of approximately four to eight volts is sufficiently close to nine volts and thus leaves the net negative charge on the floating gate of transistor 46 substantially unchanged. Thus, the drain 55 of transistor 46 can be simply allowed to float in order to prevent transistor 46 from becoming programmed. Alternatively, drain 55 may be forced to a voltage between four to eight volts by a driver connected to drain 55.

Finally, turning attention to transistor 44, the control gate and the source of this transistor have the same voltages as the control gate and the source of the addressed transistor 40 respectively. Further, the voltage of drain 54 of this transistor is at the same voltage as drain 55 of transistor 46. This is because the two drains are connected by the same metallized column line. Thus, the voltage of drain 54 of transistor 44 is approximately four to eight volts. Since the control gate of transistor 44 is at zero volts, the voltage difference between drain 54 and the control gate of transistor 44 is approximately four to eight volts. This voltage difference is low enough so that the amount of net negative charge on the floating gate of transistor 44 remains substantially unaffected. Thus, the unwanted programming of transistor 44 is prevented. In sum, the various voltages experienced by transistors 42, 46, and 44 are chosen such that none of these transistors is unintendedly programmed or "disturbed" during the programming of the addressed transistor 40. The various voltages applied to transistors 40, 42, 44, and 46 during the programming of the addressed transistor 40, are listed in FIG. 3b in the row labeled "PROGRAM." It is noted that during the programming operation, the operating voltage applied to WL2 (word line 50) is also applied to all other word lines of the storage array, except of course to word line 48 (WL1). Similarly, the operating voltage applied to column 2 is also applied to all other columns of the storage array, except of course to column 1.

The last operation to be explained is the "read" operation. A read operation is performed to retrieve the data stored in an addressed EEPROM transistor. It is noted that in the read mode, the cell is read in the "source follower" mode rather than the traditional inverter mode of many digital circuits. Thus, in the read mode of the present invention, the drain acts as the source node in a source follower configuration, and the large common source acts as the drain. It is further noted that the cell of the present invention is read by sensing voltage rather than by the traditional current sensing schemes. Suppose that transistor 40 is addressed to be read. In order to read this transistor, the control gate 58 must be raised to a sufficiently high voltage to detect the status of transistor 40. Nevertheless, the voltage of the control gate 58 must not be so high that the electric field thus created would place a large amount of negative charge on the floating gate of transistor 40. In other words, the voltage of control gate 58 must be low enough such that the desired read operation does not turn into an unwanted erase operation. It has been found that a voltage of approximately four volts is sufficiently high for a read operation, while not substantially disturbing the amount of net negative charge on the floating gate of the addressed transistor.

It is recalled that during the read operation node 52 functions as a source rather than a drain, and node 56 acts as a common drain instead of a common source. According to the present invention, prior to performing a read operation, source 52 of transistor 40 is pulled down by a high impedance load which is usually a current source. During the read operation, the voltage of source 52 of transistor 40 is determined by the threshold voltage of transistor 40, the voltage of the control gate 58 and the voltage of the common drain node 56. It is noted that the addressed transistor 40 is operated in the "source follower" mode during the read operation. This means that the output voltage placed on node 52 of transistor 40 tracks (or closely "follows") the threshold voltage that has been programmed into transistor 40 in an earlier program operation. Hence the follower mode provides a quite linear output which tracks the floating gate voltage. By contrast, in purely digital storage arrays of the prior art, the output voltage of a storage EEPROM transistor does not need to reflect the exact value stored in the transistor. The output of the storage EEPROM transistor of the prior art digital application needs to only roughly represent the stored value being represented by that transistor. This is so because to represent the stored digital value in a cell, the output of the storage EEPROM transistor of the prior art only represents the conductance state of that cell. Thus, a conducting EEPROM transistor may represent a Zero and a non-conducting EEPROM transistor may represent a One, or vice versa. This type of operation, namely a representation of either One or Zero, is a traditional inverter mode operation. The inverter mode operation is a nonlinear operation and is not well suited for analog operations of the present invention.

In sum, the source follower mode of operation of the EEPROM storage transistor of the present invention permits the EEPROM storage array of the present invention to output voltages in both analog and digital forms. By contrast, the prior art does not use a source follower mode of operation since no fine distinctions between different voltage levels represented by an EEPROM storage transistor are required for conversion into the purely digital values of the prior art.

Furthermore, during the read operation, the common drain node 56 must have a voltage low enough, for example a voltage of approximately five volts, to comply with a practical supply voltage range. On the other hand, the common drain node 56 must have a high enough voltage so that a desired degree of voltage variation is induced in source 52 when transistor 40 is being read. To strike a balance between these opposing requirements, a voltage of approximately four volts for the common drain node 56 has been found to be appropriate.

As discussed above, if transistor 40 has been erased, its threshold voltage is approximately five volts. In that case, raising the voltage of word line 48 to approximately four volts to perform the read operation will not be sufficient to make transistor 40 conductive. Therefore, if transistor 40 has been previously erased, the voltage of source 52 would, as it should, remain unchanged at zero volts. Thus, an erased transistor represents, as it should, a stored value of zero volts (or a digital value of Zero).

If transistor 40 has been programmed to represent a low voltage, the threshold voltage of that transistor, as discussed above, would be at or somewhat less than four volts. Since during the read operation the control gate 58 of transistor 40 is raised to four volts, transistor 40 reduces the voltage of source node 52 to approximately zero volts. Further, it is theoretically required that the gate to source voltage of transistor 40 remain equal to or larger than the threshold voltage of that transistor in order for transistor 40 to remain in the conductive state. Since the voltage of the control gate of transistor 40 is approximately four volts, and further since the threshold voltage of that transistor is approximately four volts, the voltage of source 52 cannot exceed zero volts. Therefore, a low voltage, which is limited to approximately zero volts, is read back as a result of a low voltage earlier programmed into transistor 40.

If transistor 40 has been programmed to represent a high voltage, the threshold voltage of that transistor, as discussed above, would be approximately one volt. Thus, since during the read operation the control gate 58 of transistor 40 is at approximately four volts, transistor 40 can raise the voltage of source node 52 to approximately three volts by the source follower action. It must be recalled that, to render transistor 40 conductive, it is theoretically required that the gate to source voltage of transistor 40 be greater than the threshold voltage of that transistor. Since the threshold voltage of transistor 40 is, in this case, approximately one volt, and further since the voltage of the control gate of transistor 40 is approximately four volts, the absolute maximum voltage of source 52 is approximately three volts. Therefore, a high voltage, which is nevertheless limited to three volts, is read back as a result of a high voltage earlier programmed into transistor 40.

Now the status of the remaining operating voltages of the read condition is explained. Since source 53 of transistor 42 is connected to the same metal column that source 52 of transistor 40 is connected to, transistor 42 must be placed in a passive mode so that it does not interfere with the voltage to be determined by source 52 of the addressed transistor 40. In order to accomplish this, word line 50 is pulled down to zero volts to render transistor 42 nonconductive. Moreover, since the control gate of transistor 46 is also connected to word line 50, this transistor would also be, as it should, in the nonconducting state.

Finally, the control gate and the drain of transistor 44 share the same voltages with their counterparts of the addressed transistor 40. Further, since transistor 46 is in the nonconductive state, transistor 44, although not being interrogated, will output its status on the metal column connected to its source 54. Thus, transistor 44, and for that matter, all of the transistors located in the row in which the addressed transistor 40 is located, will output a voltage on their respective sources as if all of those transistors were addressed to be read. However, this simultaneous response is benign. Furthermore, it is in fact usually desired to simultaneously read more than one transistor in a given row. In any event, the inadvertent reading of some EEPROM transistors, without affecting their erased or programmed states, is completely harmless. The various operating voltages used during a read operation is shown in FIG. 3b in the row labeled "READ." It is noted that during the read operation, the operating voltage applied to WL2 (word line 50) is also applied to all other word lines of the storage array, except of course to word line 48 (WL1). Similarly, the operating voltage applied to column 2 is also applied to all other columns of the storage array, except of course to column 1.

Figure 4:
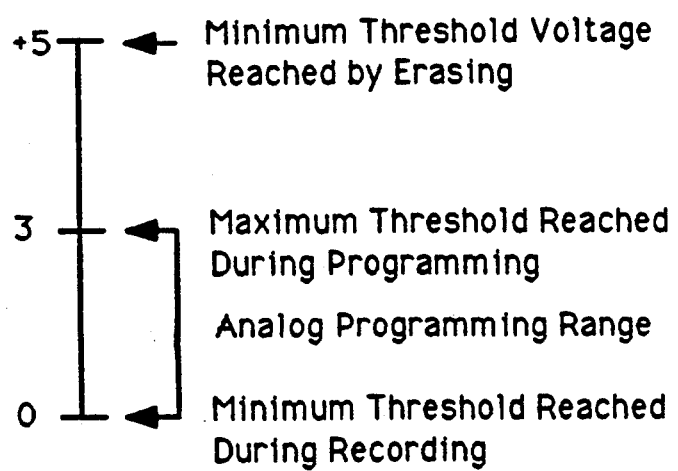
FIG. 4 shows the threshold voltages of the EEPROM storage transistor of the present invention in the erased and programmed states.

Now referring to FIG. 4, this Figure illustrates the range of threshold voltages reached by the program and erase operations. As explained above, according to the present invention, the threshold voltage of an erased EEPROM transistor is approximately five volts. Also as explained above, according to the present invention, the threshold voltage of a programmed transistor is in the range of one to four volts. These voltages are illustrated in FIG. 4.

It must be noted that one of the features of the present invention described in this document is that all of the operating voltages used for the "erase," "program," and "read" operations are above the ground voltage. By contrast, the prior art requires use of voltages of both negative and positive polarities to perform the erase, program, or read operations in the prior art EEPROM storage arrays. This feature of the present invention using only one polarity of operating voltages results in the simplification of the overall system supporting the operations of the EEPROM. For example, the need for generating negative voltages is eliminated. Further, the "latch up" problem associated with CMOS circuitry is partially prevented when only positive voltages are present on chip.

Furthermore, it is noted that although the preferred implementation of the present invention is by the use of N-channel EEPROM transistors in a P-type silicon substrate, a similar implementation using P-channel EEPROM transistors in an N-type silicon substrate is clearly within the scope of the present invention. Furthermore, the present invention may clearly be implemented by using semiconductor materials other than silicon.

Alternative Embodiment to Reduce Disturbance Impact

The present invention provides for a one transistor cell and an array of cells as well as the array operation. The invention works as described as measured in laboratory experiments. However, certain voltage margins may be somewhat narrow as to disturbance of nonselected cells during programming.

Disturbance of cells is caused by weak programming action or weak erasing action on unselected cells which are exposed to reduced potential differences during the programming of selected cells which are exposed to full potential differences. Such disturbances limit the number of "cycles" an array can be operated without re-erasing or re-clearing the array.

An improvement in the "disturb margin" can be made by partitioning the array of cells in a specific manner. The improved margin will greatly extend the number of random reprogramming cycles that can be applied to a majority of cells while leaving undisturbed information which may be desired to be kept intact in a minority number of cells in the array. The minority can be as small as one cell in an array on the order of one million cells in size, for example.

The number of nearly full array reprogramming cycles can be as high as 10,000 to 100,000 or more while leaving undisturbed even a minority of cells as small as one cell. This number of reprogramming cycles without disturbance serves well for commercial applications.

Disturbance during programming occurs for nonselected cells while a selected cell is being programmed. The disturbances are driven by intermediate level potential differences which occur across various nonselected cells as are described above. Such potential differences can occur many thousands of times across certain cells as the array is programmed even just once and many thousands or millions of times as the majority of cells are reprogrammed periodically.

Referring back to FIGS. 3a and 3b which indicate that during programming of a selected cell, such as cell 40, "full" potential difference, 18 volts, may be applied across the cell. When this occurs the other three cells experience potential differences which are less than 18 volts and hence experience various amounts of disturbance. Table I summarizes the potential differences with the three disturbance voltages identified as D1, D2 and D3, for cells 42, 44 and 46, respectively.

TABLE I

|  | D1 | D2 | D3 |
|---|---|---|---|
| Single Source Node Case for Programming | | | |
|  | 18 (Col 1) | 6 (Col 2) | 9 (WL2) |
|  | −9 (WL2) | −0 (WL1) | −6 (Col 2) |
| Disturb Potential | 9 volts | 6 volts | 3 volts |
| Double Source Node Case for Programming | | | |
|  | 18 (Col 1) | 6 (Col 2) | 12 (WL2) |
|  | −12 (WL2) | −0 (WL1) | −6 (Col 2) |
| Disturb Potential | 6 volts | 6 volts | 6 volts |

Consider the Single Source Node Case in Table I. In the above operation, the source line 56 "S" is held at a few volts above WL2, 11–13 volts, to keep cell 42 in a nonconducting state while cell 40 is being programmed. Col. 1 would otherwise be required to supply current undesirably to cell 42 or a large number of cells on column 1 configured like cell 42.

The potential differences for the disturbances are indicated in Table I as D1, D2 and D3. As a practical matter, D2 and D3 have potential differences that are low enough to be benign. However, D1 at 9 volts may be detrimental.

The overall disturbance margin can be improved by implementing an alternative to the above-described array architecture. The 9 volt D1 disturbance potential can be reduced at the expense of increasing the 3 volt D3 disturbance potential. In the following illustration the disturbance potentials will be approximately 6 volts with none arising to detrimental levels.

A three volt improvement in D1 is quite significant because the programming and erasing mechanism of the cell is based on electron tunneling. The tunneling current is an approximately exponential function of applied electric field, hence the voltage difference.

The alternative array architecture consists of adding one degree of freedom to the voltage combinations that can be applied to the cells in the array. The number of source nodes is doubled and different potentials are applied to each of the two sources during programming.

Figure 3C:
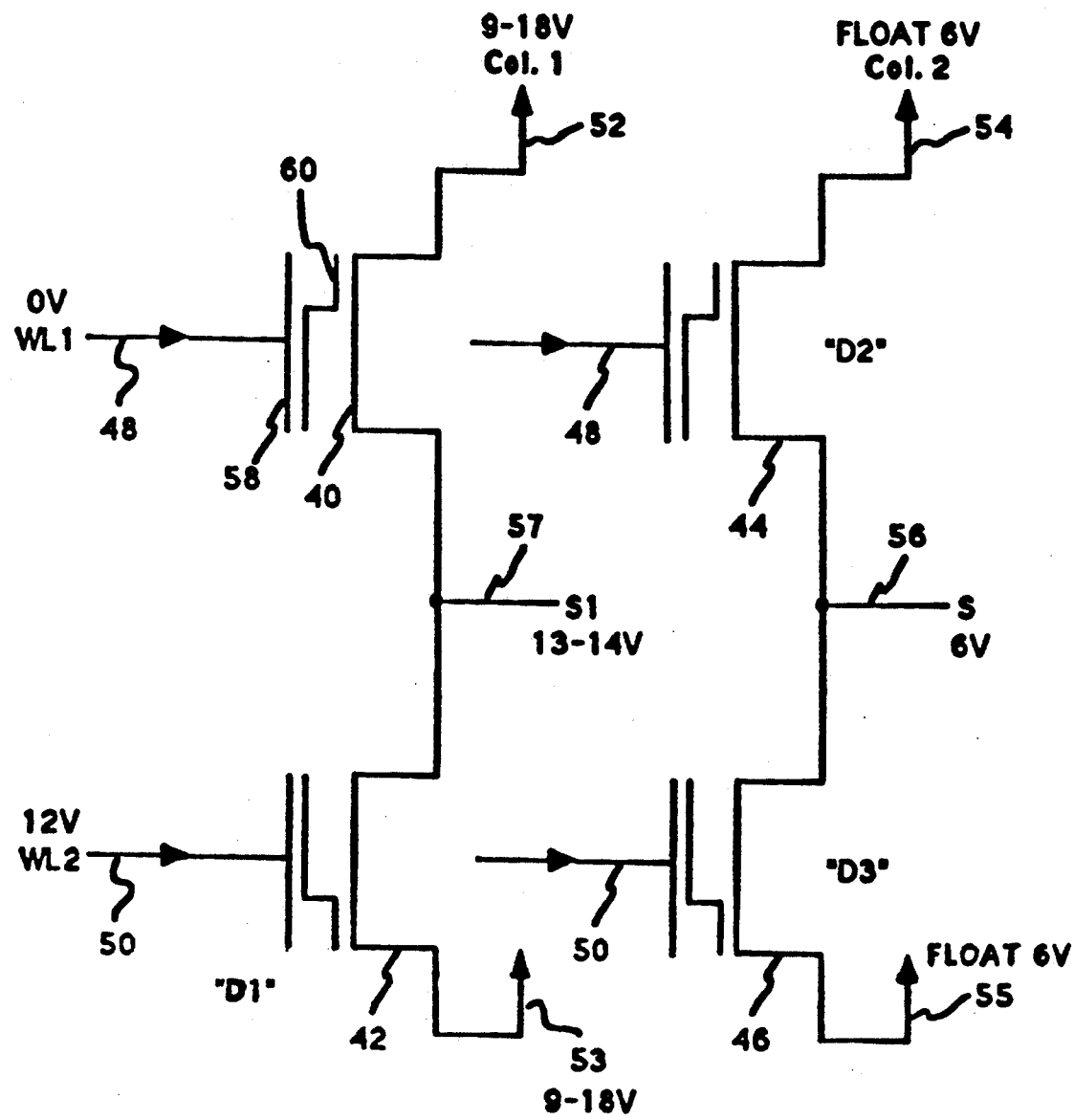
FIG. 3c depicts an alternate arrangement of the single-transistor cells of the storage array of the present invention.

Referring now to FIG. 3c there is shown an additional source node 57 "S1" separate from source node 56 "S". A different potential is applied to node S1 as compared to node S during the programming of cell 40. An increased potential of 12 volts compared to 9 volts is applied to row WL1, and source S1 will receive 13–14 volts. Source S will now receive the reduced potential of 6 volts down from 11–13 volts. The applied potentials are shown in Table II which compares the common source case with the separate source case.

TABLE II

| (Voltages Applied for Programming) | | | | | |
|---|---|---|---|---|---|
| WL1 | WL2 | Col. 1 | Col. 2 | $S_1$ | S |
| Common Source Case | | | | | |
| 0 | 9 | 18 | 6 | N/A | 11–13 |
| Separate | 0 | 12 | 18 | 6 | 11–13 | 6 |

Source Case

The resulting disturbance potentials for the Double Source Node Case are shown in Table I. Note that the three disturbance voltage stress differences are now each 6 volts. These voltage differences will result in benign disturbance results for the nonselected cells during the writing of selected cells.

In application, the actual voltages in a specific case are likely to vary among the three disturbance modes depending upon the size of the signal window, the maximum voltage applied to column 1, the particular cell geometries, internal cell capacitance and overall number of array rows and columns.

In the single source node array embodiment, a large single source node sufficed for the entire array. This case in practice requires source node metal line "straps" which might be interposed every 64 columns or so. The metal straps provide low resistance connection points to the source node as determined by the design particulars of the commercial storage device. Therefore the area penalty may be approximately one (1) extra metal line for every 64 column metal lines, yielding around a 1.5% area penalty which is generally quite acceptable.

In the double source node case, one might at first conclude that a separate source line must be required to pair with every column line which would double the size of the array—a very unexceptable penalty. However, if a group of cells share the same S1 node so that they form a "bank" of columns then the area penalty is quite small and is acceptable for practical purposes. The advantage of the small one transistor cell and dense array is preserved.

For example, for a digital storage array the array could be arranged in banks of 32 columns each. A one million cell array might have 32 banks of 32 columns. Each column might contain 1024 rows. Each bank would have a single source node like node S1 or S. As the array cells are sequenced for programming the chip control circuitry switches potentials of 13 to 14 volts or 6 volts to the source nodes in the banks as appropriate for the instant programming operation.

The area penalty is 1 part in 32 as compared to a minimum strapping configuration of 1 part in 64. The 1 part in 32 area penalty is only 1.5% additional penalty over the 1 part in 64 minimum practical case. Likewise, an analog storage array, for example, might have different numbers of columns in the banks such as 26 and a total of 32 banks and the number of rows per column might be 1200. A similar small area penalty occurs which is quite acceptable for a practical design. The advantage of a small one-transistor cell and dense array are preserved.

Finally, while the EEPROM storage array of the present invention has been disclosed and described with respect to preferred embodiments thereof, it will be understood that the apparatus and methods of the present invention may be varied without departing from the spirit and scope thereof.

I claim:

1. An electrically erasable and programmable ROM (EEPROM) storage array comprising:

a plurality of EEPROM transistors fabricated on a substrate, said EEPROM transistors being arranged in a plurality of rows and columns, each of said EEPROM transistors having spaced-apart drain and source regions in said substrate, and each of said EEPROM transistors having a floating gate and a control gate;

said source region of each of said EEPROM transistors being in common with said source region of an EEPROM transistor of an adjacent row of said array;

said control gate of each of said EEPROM transistors being electrically connected to said control gates of all other EEPROM transistors of the same respective row of said array;

said drain region of each of said EEPROM transistors being electrically connected to said drain regions of all other EEPROM transistors of the same respective column of said array by a single patterned layer of metalization;

said control gates, sources, and drains of said EEPROM transistors being means for receiving a plurality of operating voltages for driving said control gates, said sources, and said drains of said EEPROM transistors, respectively, and for erasing, programming or reading from an addressed EEPROM transistor, each of said plurality of operating voltages always having a voltage above the substrate voltage, said floating gate of said addressed EEPROM transistor having a net negative charge after erasing, programming, or reading from said addressed EEPROM transistor, thereby causing said addressed EEPROM transistor to have a threshold voltage greater than approximately one volt after erasing, programming, or reading of said addressed EEPROM transistor.

2. The EEPROM storage array of claim 1 wherein said source region of each of said EEPROM transistors is in common with said source region of all other EEPROM transistors of the same respective row of said array, and is in common with said source regions of all EEPROM transistors of an adjacent row of said array.

3. The EEPROM storage array of claim 2 wherein said erasing of said addressed EEPROM transistor is performed by sufficiently raising the operating voltage of said control gate of said addressed EEPROM transistor, and sufficiently lowering the operating voltages of said drain and said source of said addressed EEPROM transistor so that the amount of net negative charge on said floating gate of said addressed EEPROM transistor is substantially increased;

and wherein the operating voltages of the control gates of said all other EEPROM transistors of said adjacent row are sufficiently lowered so that the net negative charge on the floating gates of said all other EEPROM transistors of said adjacent row remains substantially unchanged.

4. The EEPROM storage array of claim 3, wherein said operating voltage of said control gate of said addressed EEPROM transistor is approximately eighteen volts above said substrate voltage, and wherein said operating voltages of said drain and said source of said addressed EEPROM transistor are approximately equal to said substrate voltage;

and wherein said operating voltages of said control gates of said all other EEPROM transistors of said adjacent row are approximately equal to said substrate voltage.

5. The EEPROM storage array of claim 3 wherein after erasing said addressed EEPROM transistor, the threshold voltage of said addressed EEPROM transistor is sufficiently above said substrate voltage so as to prevent said addressed EEPROM transistor from forming a conductive channel between its source and drain when the voltage of said control gate of said addressed EEPROM transistor is not more than approximately one volt above said substrate voltage.

6. The EEPROM storage array of claim 5 wherein after erasing said addressed EEPROM transistor the threshold voltage of said addressed EEPROM transistor is approximately five volts above said substrate voltage.

7. The EEPROM storage array of claim 2 wherein said programming of said addressed EEPROM transistor is performed by causing the amount of net negative charge in said floating gate of said addressed EEPROM transistor to be inversely proportional to the analog voltage level being stored in said addressed EEPROM transistor.

8. The EEPROM storage array of claim 7 wherein said programming of said addressed EEPROM transistor is performed by sufficiently lowering the operating voltage of said control gate of said addressed EEPROM transistor and sufficiently raising the operating voltage of said drain of said addressed EEPROM transistor so that the amount of net negative charge on said floating gate of said addressed EEPROM transistor is reduced;

and wherein the operating voltage of the control gates of said all other EEPROM transistors of said adjacent row are sufficiently raised so that the net negative charge on the floating gates of said all other EEPROM transistors of said adjacent row remains substantially unchanged;

and wherein the operating voltage of the source of said addressed EEPROM transistor is sufficiently raised so as to prevent the operating voltage of said drain of said addressed EEPROM transistor from being substantially reduced by the conductive channels formed between the respective sources and drains of each of said all other EEPROM transistors of said adjacent row.

9. The EEPROM storage array of claim 8, wherein said operating voltage of said control gate of said addressed EEPROM transistor is approximately equal to said substrate voltage, and wherein said operating voltage of said drain of said addressed EEPROM transistor is approximately between nine to eighteen volts above said substrate voltage;

and wherein said operating voltage of said control gates of said all other EEPROM transistors of said adjacent row are each approximately nine volts above said substrate voltage;

and wherein said operating voltage of said source of said addressed EEPROM transistor is approximately eleven to thirteen volts above said substrate voltage.

10. The EEPROM storage array of claim 8 wherein after programming said addressed EEPROM transistor, the threshold voltage of said addressed EEPROM transistor is sufficiently above said substrate voltage so as to prevent said addressed EEPROM transistor from forming a conductive channel between its source and drain when the voltage of said control gate of said addressed EEPROM transistor is not more than approximately one volt above said substrate voltage.

11. The EEPROM storage array of claim 10 wherein after programming said addressed EEPROM transistor the threshold voltage of said addressed EEPROM transistor is between approximately one volt above said substrate voltage and four volts above said substrate voltage.

12. The EEPROM storage array of claim 1 wherein said programming of said addressed EEPROM transistor is performed by causing the amount of net negative charge in said floating gate of said addressed EEPROM transistor to be inversely proportional to the analog voltage level being stored in said addressed EEPROM transistor.

13. The EEPROM storage array of claim 12 wherein said programming of said addressed EEPROM transistor is performed by sufficiently lowering the operating voltage of said control gate of said addressed EEPROM transistor and sufficiently raising the operating voltage of said drain of said addressed EEPROM transistor so that the amount of net negative charge on said floating gate of said addressed EEPROM transistor is reduced;

and wherein the operating voltage of the control gates of said all other EEPROM transistors of said adjacent row are sufficiently raised so that the net negative charge on the floating gates of said all other EEPROM transistors of said adjacent row remains substantially unchanged;

and wherein the operating voltage of the source of said addressed EEPROM transistor is sufficiently raised so as to prevent the operating voltage of said drain of said addressed EEPROM transistor from being substantially reduced by the conductive channels formed between the respective sources and drains of each of said all other EEPROM transistors of said adjacent row.

14. The EEPROM storage array of claim 13, wherein said operating voltage of said control gate of said addressed EEPROM transistor is approximately equal to said substrate voltage, and wherein said operating voltage of said drain of said addressed EEPROM transistor is approximately between nine to eighteen volts above said substrate voltage;

and wherein said operating voltage of said control gates of said all other EEPROM transistors of said adjacent row are each approximately twelve volts above said substrate voltage;

and wherein said operating voltage of said source of said addressed EEPROM transistor is approximately eleven to thirteen volts above said substrate voltage;

and wherein said operating voltage of said source of all other EEPROM transistors of said row of said addressed EEPROM is approximately six volts above said substrate voltage.

15. The EEPROM storage array of claim 13 wherein after programming said addressed EEPROM transistor, the threshold voltage of said addressed EEPROM transistor is sufficiently above said substrate voltage so as to prevent said addressed EEPROM transistor from forming a conductive channel between its source and drain when the voltage of said control gate of said addressed EEPROM transistor is not more than approximately one volt above said substrate voltage.

16. The EEPROM storage array of claim 15 wherein after programming said addressed EEPROM transistor the threshold voltage of said addressed EEPROM transistor is between approximately one volt above said substrate voltage and four volts above said substrate voltage.

17. The EEPROM storage array of claim 2 wherein said reading of said addressed EEPROM transistor is performed by causing said drain voltage of said addressed EEPROM transistor to be inversely proportional to said net negative charge on said floating gate, thereby causing said drain voltage of said addressed EEPROM transistor to be directly proportional to said analog voltage level stored in said EEPROM transistor.

18. The EEPROM storage array of claim 17 wherein said reading of said addressed EEPROM transistor is performed by sufficiently raising the operating voltage of said control gate of said addressed EEPROM transistor and sufficiently raising the operating voltage of said source of said addressed EEPROM transistor so that the drain of said addressed EEPROM transistor outputs a drain voltage, which drain voltage is determined by said operating voltage of said source, said operating voltage of said control gate, and said net negative charge on said floating gate of said addressed EEPROM transistor, wherein a large net negative charge on said floating gate of said addressed EEPROM transistor causes a low drain voltage to be outputted on said drain of said addressed EEPROM transistor, and wherein a small net negative charge on said floating gate of said addressed EEPROM transistor causes a high drain voltage to be outputted on said drain of said addressed EEPROM transistor, and wherein said drain voltage of said addressed EEPROM transistor determines the voltage of the column in which said addressed EEPROM transistor is located;

and wherein the operating voltages of the control gates of said all other EEPROM transistors of said adjacent row are sufficiently lowered so that the voltage of said column in which said addressed EEPROM transistor is located can be determined by said drain voltage of said addressed EEPROM transistor.

19. The EEPROM storage array of claim 18, wherein said operating voltage of said control gate of said addressed EEPROM transistor is approximately four volts, and wherein said operating voltage of said source of said addressed EEPROM transistor is approximately four volts above said substrate voltage;

and wherein said operating voltage of said control gates of said all other EEPROM transistors of said adjacent row are each approximately equal to said substrate voltage;

and wherein said output drain voltage of said addressed EEPROM transistor is between approximately zero volts and approximately three volts above said substrate voltage.

20. The EEPROM storage array of claim 18 wherein after reading said addressed EEPROM transistor, the threshold voltage of said addressed EEPROM transistor remains approximately equal to said threshold voltage of said addressed EEPROM transistor prior to the reading operation.

21. The EEPROM storage array of claim 1 wherein said addressed EEPROM transistor represents a plurality of discrete voltage levels, each of said plurality of discrete voltage levels being between said substrate voltage and three volts above said substrate voltage, each of said plurality of discrete voltage levels corresponding to a digital value being represented by said addressed EEPROM storage transistor.

22. The EEPROM storage array of claim 1 wherein said reading from said addressed EEPROM transistor is performed by operating said addressed EEPROM transistor in the source follower mode, thereby causing said addressed EEPROM transistor to output an analog voltage inversely proportional to said threshold voltage of said addressed EEPROM transistor.

23. The EEPROM storage array of claim 1 wherein said EEPROM transistors are fabricated in a silicon substrate of a first conductivity type, and wherein said drain and source regions are comprised of a second conductivity type disposed in said silicon substrate, and wherein said floating gate is disposed above and substantially between said source and said drain regions, and wherein said control gate is disposed above said floating gate.

24. The EEPROM storage array of claim 23, wherein said EEPROM transistors are fabricated on a P-type silicon substrate, and wherein said drain and source regions are comprised of N-type silicon disposed in said P-type silicon substrate, and wherein said floating gate and said control gate are comprised of polysilicon.

25. A method of storing digital or analog information in an electrically erasable and programmable ROM (EEPROM) storage array, said method comprising the steps of:

providing a plurality of EEPROM transistors fabricated on a substrate, said EEPROM transistors being arranged in a plurality of rows and columns, each of said EEPROM transistors having spaced-apart drain and source regions in said substrate, and each of said EEPROM transistor having a floating gate and a control gate, said source region of each of said EEPROM transistors being in common with said source region of an EEPROM transistor of an adjacent row of said array, said control gate of each of said EEPROM transistors being electrically connected to said control gate of all other EEPROM transistors of the same respective row of said array, said drain region of each of said EEPROM transistors being electrically connected to said drain regions of all other EEPROM transistors of the same respective column of said array by a single patterned layer of metalization;

supplying a plurality of operating voltages for use by said EEPROM transistors in said EEPROM storage array, each of said plurality of operating voltages having a voltage above the substrate voltage;

providing for distribution of said plurality of operating voltages to said source, drain, and control gate of each of said EEPROM transistors, said plurality of operating voltages being used for erasing, programming, or reading from an addressed EEPROM transistor;

maintaining a net negative charge on said floating gate of said addressed EEPROM transistor after erasing, programming, or reading from said addressed EEPROM transistor, so as to cause the threshold voltage of said addressed EEPROM transistor to always remain approximately one volt above said substrate voltage;

erasing said addressed EEPROM transistor by inducing an electric field directed from said control gate to said drain of said addressed EEPROM transistor so as to cause said floating gate of said addressed EEPROM transistor to become sufficiently negatively charged so that said threshold voltage of said addressed EEPROM transistor becomes significantly larger than said substrate voltage;

programming said addressed EEPROM transistor by inducing an electric field directed from said drain to said control gate of said addressed EEPROM transistor so as to cause said floating gate of said addressed EEPROM transistor to bear a net negative charge, said net negative charge being inversely proportional to an analog voltage level being stored in said addressed EEPROM transistor;

maintaining a sufficiently low electric field between said control gates and said drains of all other EEPROM transistors in said array such that the net negative charge on said floating gates of said all other EEPROM transistors remains equal to the net negative charge that said floating gates of said all other EEPROM transistors bore prior to said programming of said addressed EEPROM transistor; and reading from said addressed EEPROM transistor by raising said control gate voltage of said addressed EEPROM transistor sufficiently so as to exceed the threshold voltage of said addressed EEPROM transistor, and further raising the operating voltage of said source of said addressed EEPROM transistor so as to cause said drain of said addressed EEPROM transistor to represent a voltage directly proportional to the analog voltage level stored in said EEPROM transistor during said programming.

26. The EEPROM storage array of claim 25 wherein said source region of each of said EEPROM transistors is in common with said source region of all other EEPROM transistors of the same respective row of said array, and is in common with said source regions of all EEPROM transistors of an adjacent row of said array.

27. The method of claim 26 wherein said erasing of said addressed EEPROM transistor is performed by raising the operating voltage of said addressed EEPROM transistor to approximately eighteen volts above said substrate voltage, and further by lowering said operating voltages of said drain and said source of said addressed EEPROM transistor to be approximately equal to said substrate voltage;

and wherein said operating voltages of said control gates of said all other EEPROM transistors of said adjacent row are each lowered to be approximately equal to said substrate voltage.

28. The method of claim 27 wherein after erasing said addressed EEPROM transistor, the threshold voltage of said addressed EEPROM transistor is sufficiently above said substrate voltage such that said addressed EEPROM transistor cannot form a conductive channel between its source and drain when the voltage of said control gate of said addressed EEPROM transistor is not more than approximately one volt above said substrate voltage.

29. The method of claim 28 wherein after erasing said addressed EEPROM transistor the threshold voltage of said addressed EEPROM transistor is approximately five volts above said substrate voltage.

30. The method of claim 26 wherein said programming of said addressed EEPROM transistor is performed by lowering the operating voltage of said control gate of said addressed EEPROM transistor to be approximately equal to said substrate voltage, and wherein the operating voltage of said drain of said addressed EEPROM transistor is kept between approximately nine to eighteen volts above said substrate voltage;

and wherein the operating voltages of said control gates of all other EEPROM transistors located in the row adjacent to the row in which said addressed EEPROM transistor are each located is approximately nine volts above said substrate voltage;

and wherein said operating voltage of said source of said addressed EEPROM transistor is kept at approximately eleven to thirteen volts above said substrate voltage.

31. The method of claim 30 wherein after programming said addressed EEPROM transistor, the threshold voltage of said addressed EEPROM transistor is sufficiently above said substrate voltage such that said addressed EEPROM transistor cannot form a conductive channel between its source and drain when the voltage of said control gate of said addressed EEPROM transistor is not more than approximately one volt above said substrate voltage.

32. The method of claim 31 wherein after programming said addressed EEPROM transistor the threshold voltage of said addressed EEPROM transistor is approximately between one volt above said substrate voltage and four volts above said substrate voltage.

33. The method of claim 25 wherein said programming of said addressed EEPROM transistor is performed by lowering the operating voltage of said control gate of said addressed EEPROM transistor to be approximately equal to said substrate voltage, and wherein the operating voltage of said drain of said addressed EEPROM transistor is kept between approximately nine to eighteen volts above said substrate voltage;

and wherein the operating voltage of said control gates of all other EEPROM transistors located in the row adjacent to the row in which said addressed EEPROM transistor is located is approximately twelve volts above said substrate voltage;

and wherein said operating voltage of said source of said addressed EEPROM transistor is kept at approximately eleven to thirteen volts above said substrate voltage;

and wherein said operating voltages of said sources of all other EEPROM transistors of said row of said addressed EEPROM transistors are each approximately six volts above said substrate voltage.

34. The method of claim 33 wherein after programming said addressed EEPROM transistor, the threshold voltage of said addressed EEPROM transistor is sufficiently above said substrate voltage such that said addressed EEPROM transistor cannot form a conductive channel between its source and drain when the voltage of said control gate of said addressed EEPROM transistor is not more than approximately one volt above said substrate voltage.

35. The method of claim 34 wherein after programming said addressed EEPROM transistor the threshold voltage of said addressed EEPROM transistor is approximately between one volt above said substrate voltage and four volts above said substrate voltage.

36. The method of claim 26 wherein said reading from said addressed EEPROM transistor is performed by raising the operating voltage of said control gate of said addressed EEPROM transistor to approximately four volts above said substrate voltage, and further by raising the operating voltage of said source of said addressed EEPROM transistor to approximately four volts above said substrate voltage;

and wherein the operating voltages of said control gates of the EEPROM transistors located in the row adjacent to the row in which said addressed EEPROM transistor is located are each approximately equal to said substrate voltage;

and wherein the voltage of said drain of said addressed EEPROM transistor varies approximately between said substrate voltage and three volts above said substrate voltage.

37. The method of claim 36 wherein after reading said addressed EEPROM transistor, the threshold voltage of said addressed EEPROM transistor remains approximately equal to said threshold voltage of said addressed EEPROM transistor prior to said reading operation.

38. The method of claim 37 wherein after reading said addressed EEPROM transistor the threshold voltage of said addressed EEPROM transistor remains approximately between one volt above said substrate voltage and four volts above said substrate voltage.

39. The method of claim 25 wherein said addressed EEPROM transistor represents a plurality of discrete voltage levels, each of said plurality of discrete voltage levels being between said substrate voltage and three volts above said substrate voltage, each of said plurality of discrete voltage levels corresponding to a digital value being represented by said addressed EEPROM transistor.

40. The method of claim 25 wherein said reading from said addressed EEPROM transistor is performed by operating said addressed EEPROM transistor in the source follower mode, thereby causing said addressed EEPROM transistor to output an analog voltage inversely proportional to said threshold voltage of said addressed EEPROM transistor.

41. The method of claim 25 wherein said EEPROM transistors are fabricated in a silicon substrate of a first conductivity type, and wherein said drain and said source are made of a second conductivity type disposed in said silicon substrate, and wherein said floating gate is disposed above and substantially between said source and said drain, and wherein said control gate is disposed above said floating gate.

42. The method of claim 41 wherein said EEPROM transistors are fabricated on a P-type silicon substrate, and wherein said drain and said source are comprised on N-type silicon disposed in said P-type silicon substrate, and wherein said floating gate and said control gate are made of polysilicon.

43. The method of claim 25 wherein said programming of said addressed EEPROM transistor is performed by causing the collection of the net negative charge in said floating gate of said addressed EEPROM transistor to be inversely proportional to the analog voltage level being stored in said addressed EEPROM transistor.

44. The method of claim 25 wherein said reading of said addressed EEPROM transistor is performed by causing said drain voltage of said addressed EEPROM transistor to be inversely proportional to said net negative charge on said floating gate of said addressed EEPROM transistor, so as to cause said drain voltage of said addressed EEPROM transistor to be directly proportional to said analog voltage level stored in said addressed EEPROM transistor.

* * * * *